United States Patent
Devins et al.

(10) Patent No.: US 6,658,633 B2
(45) Date of Patent: Dec. 2, 2003

(54) AUTOMATED SYSTEM-ON-CHIP INTEGRATED CIRCUIT DESIGN VERIFICATION SYSTEM

(75) Inventors: Robert J. Devins, Essex Junction, VT (US); James R. Robinson, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 09/969,675

(22) Filed: Oct. 3, 2001

(65) Prior Publication Data

US 2003/0093764 A1 May 15, 2003

(51) Int. Cl.[7] .............................. G06F 17/50; G06F 9/45
(52) U.S. Cl. ...................... 716/5; 716/1; 716/4; 716/6; 716/11; 703/13; 703/14; 703/15; 703/16; 703/17
(58) Field of Search .................. 716/1–21; 702/118; 703/14; 710/5; 712/25; 714/33; 717/109, 110

(56) References Cited

U.S. PATENT DOCUMENTS 6,427,224 B1 * 7/2002 Devins et al. .................. 716/4
6,456,961 B1 * 9/2002 Patil et al. ..................... 703/14

OTHER PUBLICATIONS

Chauhan et al., "Verifying IP–Core based System–On–Chip Designs", IEEE, 1999, pp. 27–31.*

Rincon et al., "Core Design and System–on–a Chip Integration", IEEE, 1997, pp. 26–35.*

* cited by examiner

Primary Examiner—Vuthe Siek
Assistant Examiner—Helen Rossoshek
(74) Attorney, Agent, or Firm—Schmeiser, Olsen & Watts; Richard M. Kotulak

(57) ABSTRACT

Disclosed is a method of verifying the design of an integrated circuit chip comprised of one or more cores, comprising: creating a project core catalog comprising driver description files and application description files for each core; creating a system definition file for the integrated circuit chip; inputting the driver description files, the application description files and the system definition files into a code generator, the code generator outputting a test operating system test code; and applying the test operating system test code to a software simulation of the integrated circuit chip to perform design verification.

24 Claims, 9 Drawing Sheets

US 6,658,633 B2

AUTOMATED SYSTEM-ON-CHIP INTEGRATED CIRCUIT DESIGN VERIFICATION SYSTEM

FIELD OF THE INVENTION

The present invention relates to the field of testing computer system designs by software simulation; more specifically, it relates to an automated system for system-on-chip (SOC) design verification.

CROSS REFERENCE TO RELATED APPLICATIONS

This application is related by common inventorship and subject matter to co-pending applications titled "Method of Controlling External Models in System-On-Chip Verification" Ser. No. 09/494,230, "Simulator-Independent System-On-Chip Verification Methodology" Ser. No. 09/494,565, "Method of Developing Re-Usable Software for Efficient Verification of System-On-Chip Integrated Circuit Designs" Ser. No. 09/494,907, "Method for Efficient Verification of System-On-Chip Integrated Circuit Designs Including an Embedded Processor" Ser. No. 09/494,564, "Processor-Independent System-On-Chip Verification for Embedded Processor Systems" Ser. No. 09/494,386, and "Method for Re-Using System-On-Chip Verification Software in an Operating System" Ser. No. 09/495,236. The listed applications are assigned to International Business Machines Corporation and are entirely incorporated herein by this reference.

BACKGROUND OF THE INVENTION

The complexity and sophistication of present-day integrated circuit (IC) chips have advanced significantly over those of early chip designs. Where formerly a chip might embody relatively simple electronic logic blocks effected by interconnections between logic gates, currently chips can include combinations of complex, modularized IC designs often called "cores" which together constitute an entire SOC.

In general, IC chip development includes a design phase and a verification phase for determining whether a design works as expected. The verification phase has moved increasingly toward a software simulation approach to avoid the costs of first implementing designs in hardware to verify them.

A key factor for developers and marketers of IC chips in being competitive in business is time-to-market of new products; the shorter the time-to-market, the better the prospects for sales. Time-to-market in turn depends to a significant extent on the duration of the verification phase for new products to be released.

As chip designs have become more complex, shortcomings in existing chip verification methodologies which extend time-to-market have become evident.

Typically, in verifying a design, a simulator is used. Here, "simulator" refers to specialized software whose functions include accepting software written in a hardware description language (HDL) such as Verilog or VHDL which models a circuit design (for example, a core as described above), and using the model to simulate the response of the design to stimuli which are applied by a test case to determine whether the design functions as expected. The results are observed and used to de-bug the design.

In order to achieve acceptably bug-free designs, verification software must be developed for applying a number of test cases sufficient to fully exercise the design in simulation. In the case of SOC designs, the functioning of both the individual cores as they are developed, and of the cores functioning concurrently when interconnected as a system must be verified. Moreover, a complete SOC design usually includes an embedded processor core; simulation which includes a processor core tends to require an inordinate amount of time and computing resources, largely because the processor is usually the most complex piece of circuitry on the chip and interacts with many other cores.

It can be appreciated from the foregoing that verification of an SOC can severely impact time-to-market, due to the necessity of developing and executing software for performing the numerous test cases required to fully exercise the design.

However, inefficiencies in current verification methodologies exacerbate time pressures. For example, design specific verification software must be written or the existing software modified for each specific chip design to be verified.

A verification methodology is needed which will reduce the amount of chip specific design verification software required as well as reduce the time to collect and integrate that software.

SUMMARY OF THE INVENTION

A first aspect of the present invention is a method of verifying the design of an integrated circuit chip comprised of one or more cores, comprising: creating a project core catalog comprising driver description files and application description files for each core; creating a system definition file for the integrated circuit chip; inputting the driver description files, the application description files and the system definition files into a code generator, the code generator outputting a test operating system test code; and applying the test operating system test code to a software simulation of the integrated circuit chip to perform design verification.

A second aspect of the present invention is a program storage device readable by machine, tangibly embodying a program of instructions executable by the machine to perform method steps for verifying the design of an integrated circuit chip comprised of one or more cores the method steps comprising: creating a project core catalog comprising driver description files and application description files for each core; creating a system definition file for the integrated circuit chip; inputting the driver description files, the application description files and the system definition files into a code generator, the code generator outputting a test operating system test code; and applying the test operating system test code to a software simulation of the integrated circuit chip to perform design verification.

A third aspect of the present invention is a computer system comprising a processor, an address/data bus coupled to the processor, and a computer-readable memory unit coupled to communicate with the processor, the memory unit containing instructions that when executed implement a method for verifying the design of an integrated circuit chip comprised of one or more cores, the method comprising the computer implemented steps of: creating a project core catalog comprising driver description files and application description files for each core; creating a system definition file for the integrated circuit chip; inputting the driver description files, the application description files and the system definition files into a code generator, the code generator outputting a test operating system test code; and applying the test operating system test code to a software simulation of the integrated circuit chip to perform design verification.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

The term "core" as used herein refers to a module of logic for an integrated circuit chip design of any degree of complexity, which may be used as a component of a SOC. For the purposes of the present invention, SOC and chip are equivalent terms. In its developmental stages, a core is typically embodied as a simulatable HDL program written at some level of abstraction, or in a mixture of abstraction levels, which can describe the function of the core prior to its actual physical implementation in silicon. Major levels of abstraction that are generally recognized include a behavioral level, a structural level and a logic gate level. A core may be in the form of a netlist including behavioral, structural and logic gate elements. Ultimately, after verification, design logic represented by a core is physically implemented in hardware.

Figure 1:
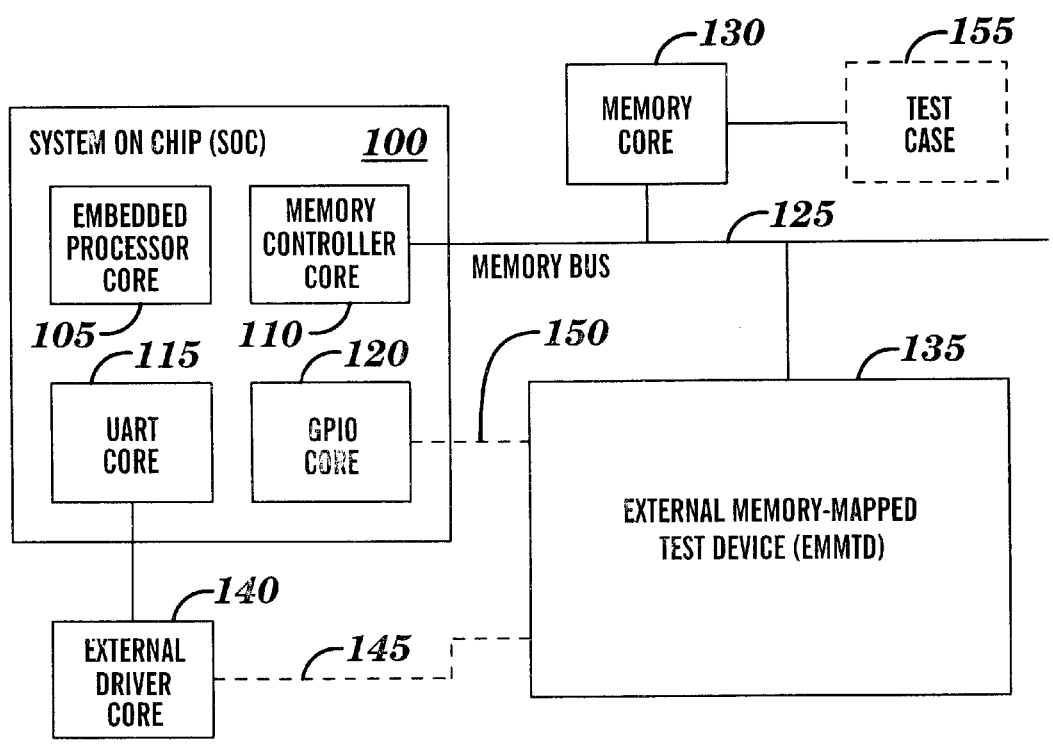
FIG. 1 illustrates an SOC communicated with/controlled by an external memory mapped test device (EMMTD) in response to a test case supplied by a test operating system (TOS)

FIG. 1 illustrates an SOC communicated with/controlled by an external memory mapped test device (EMMTD) in response to a test case supplied by a test operating system (TOS).

In FIG. 1, SOC 100 includes an embedded processor core 105, a memory controller core 110, a universal asynchronous receiver transmitter (UART) core 115 and a general purpose I/O core (GPIO) 120. Memory controller core 110 is coupled via a memory bus 125 to an external memory core 130. UART core 115 is coupled to an EMMTD 135 by an external driver core 140 via a first signal line 145. GPIO 120 is coupled to EMMTD 135 via second signal line 150. EMMTD is further coupled to memory bus 125.

For the purposes of the present invention, SOC 100 is intended to include embodiments in any known form of logic design, including simulatable HDL modules and netlists. In one example, embedded processor core 105, memory controller core 110, UART core 115, GPIO core 120, external memory core 130, EMMTD 135, and external driver core 140 are HDL modules being simulated by a simulator (not shown), memory bus 125 and first and second signal lines 145 and 150 represent virtual connections implemented by code specifications.

Also shown in FIG. 1 is test case 155, representing computer-executable instructions loaded into external memory core 130 and executed by embedded processor core 105 to perform verification of SOC 100. Test case 155 is a set of computer-executable instructions which generate stimuli to verify the design of SOC 100. The application of the test case typically produces, as output, result data representing the response of the simulated design which is compared to expected results, to determine whether the design functions as expected. The design may subsequently be revised to improve performance or de-bug errors.

Figure 2:
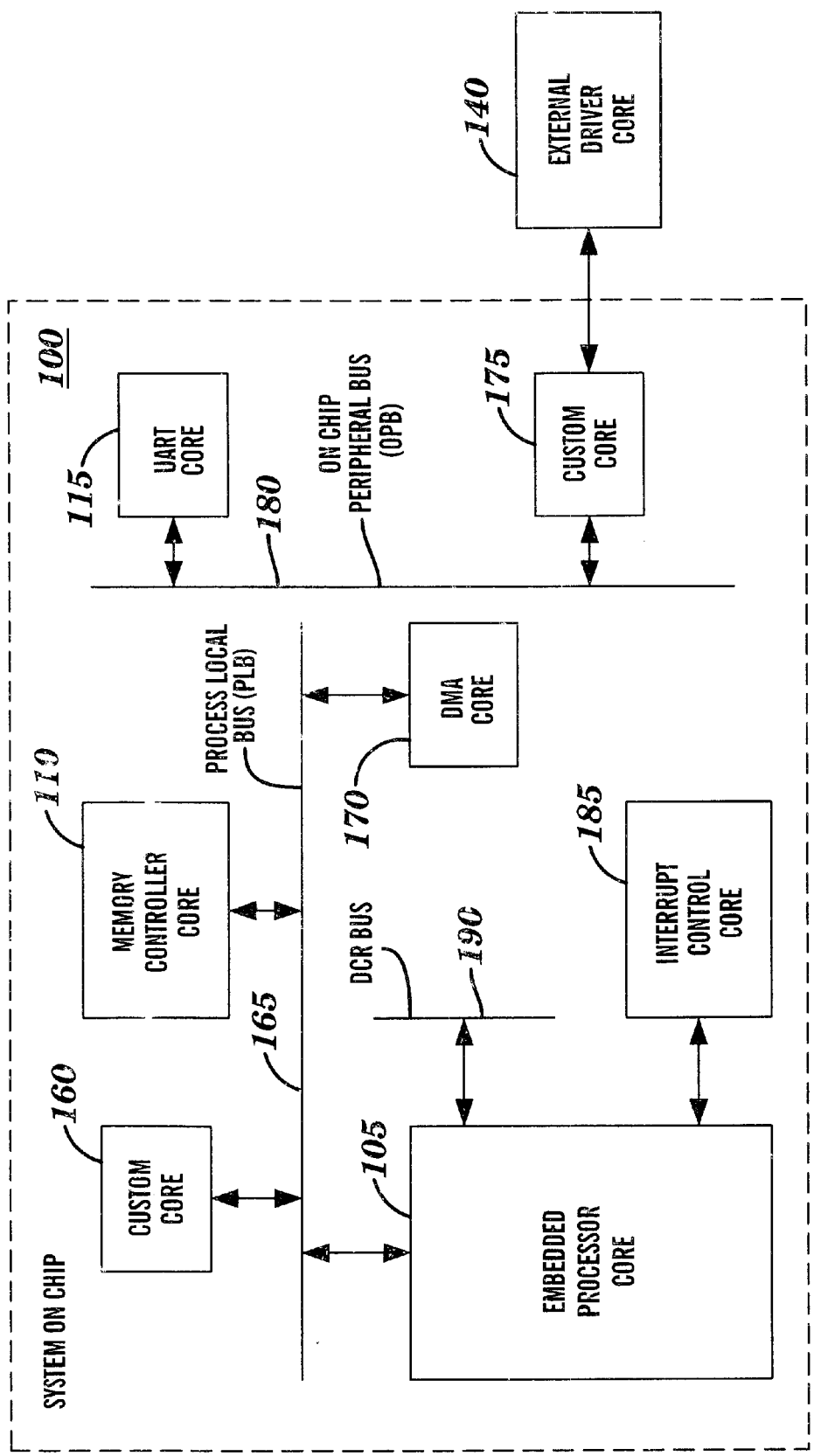
FIG. 2 is illustrates the SOC of FIG. 1 in more detail.

In the case of an SOC design including multiple cores as shown in FIG. 1, it is typically desirable to simulate interaction among the component internal cores and external cores; the EMMTD helps to make this simulation more realistic by allowing test case 155 to control and communicate with the external cores as well as the internal cores FIG. 2 is illustrates the SOC of FIG. 1 in more detail. In FIG. 1, SOC 100 further includes a first custom core 160 coupled to a processor local bus (PLB) 165 and a Direct Memory Access (DMA) core 170 coupled to the PLB. Embedded processor core 105 and memory controller core 110 are also coupled to PLB 165. UART core 115 and a second custom core 175 are coupled to an on-chip peripheral bus (OPB) 180. Coupled to embedded processor core 105 are an interrupt control core 185 and a device control register (DCR) bus 190. A second custom core 175 is coupled to external core driver 140. First and second custom cores 160 and 175 represent design logic tailored to a particular application of the SOC. Other cores, such as UART core 115 and DMA core 170, may have well-standardized embodiments (sometimes called Application-Specific Integrated Circuits Cores or ASICs Cores) which are widely available from vendors. Typically, the design of a SOC comprises a combination of such custom cores and ASICs Cores.

A UART has the basic function of receiving and transmitting data, once configured. Thus, a functional model of a UART might consist simply of "Configure", "Receive" and "Transmit" functions. For example, in a typical UART "Receive" operation, upon request from a higher level of software, bits of data representing a character are shifted into a receive buffer through the serial-in bit at a given baud rate, and the UART generates an interrupt to signal that the character has been received. In a typical "Transmit" operation, the UART shifts bits of character data out through a serial-out pin, and generates an interrupt to signal that the receive buffer is empty.

Thus, the "Configure", "Receive" and "Transmit" functions mentioned above represent an abstraction of a UART core, which may be presented by an low-level device driver (LLDD)as an application program interface (API) to a higher level of software such as a test application, in the present example, test case 155 of FIG. 1.

Figure 3:
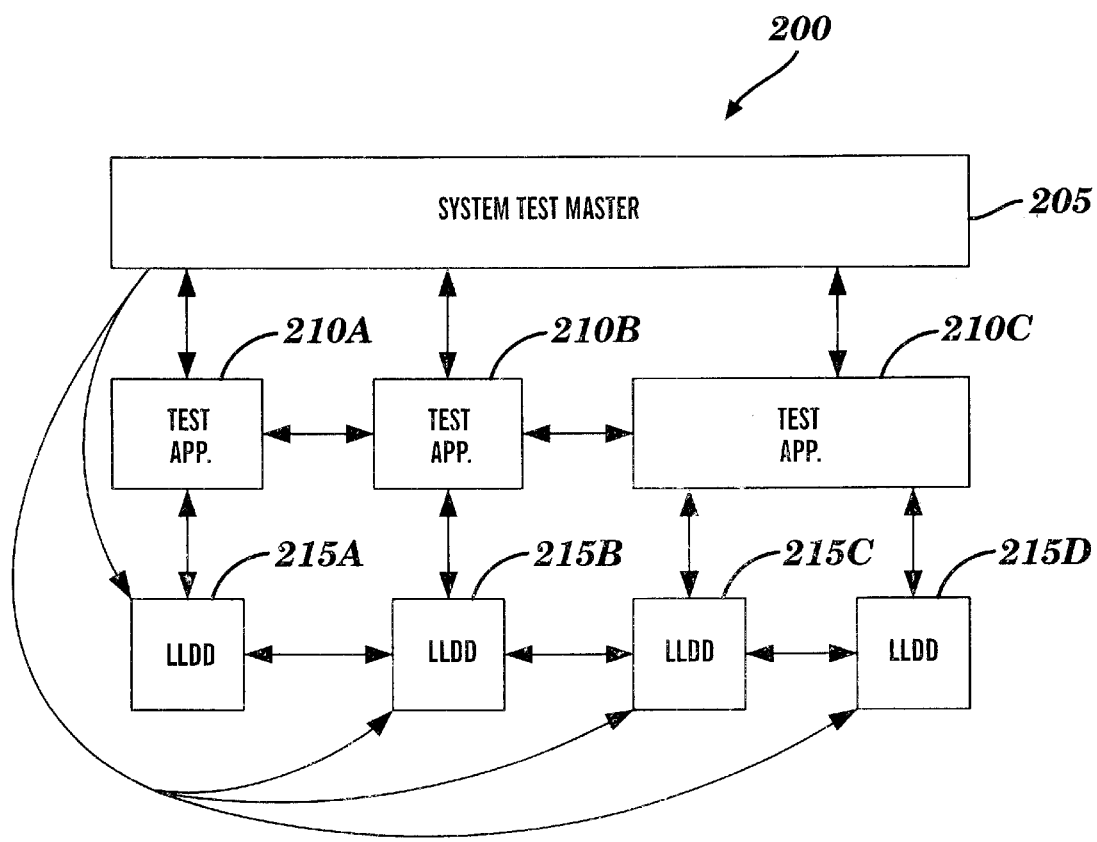
FIG. 3 illustrates the flow of communications in TOS for applying test cases to the SOC of FIG. 2.

FIG. 3 illustrates the flow of communications in a TOS for applying test cases to the SOC of FIG. 2. In FIG. 3, TOS 200 includes a top-level exerciser such as a system test master 205, test applications 210A, 210B and 210C and LLDDs 215A, 215B, 215C and 215D. In TOS 200, information (represented by directed lines) relating to a test is exchanged between system test master 205, and test applications 210A, 210B and 210C, between the test applications; to LLDDs 215A, 215B, 215C and 215D and between the LLDDs to the system test master. LLDDs 215A, 215B, 215C and 215D communicate information related to operations on the core being tested to their associated test applications. TOS 200 manages the dispatching of test applications and LLDDs in response to the exchange of information. Components of the TOS including test applications, core and system test masters may be designated "tasks" in an embodiment of the invention. Testing of multiple cores to simulate hardware interaction among SOC components is enabled in the TOS by a multi-tasking system. The multi-tasking system utilizes a hierarchically-organized communication and control system.

Figure 4:
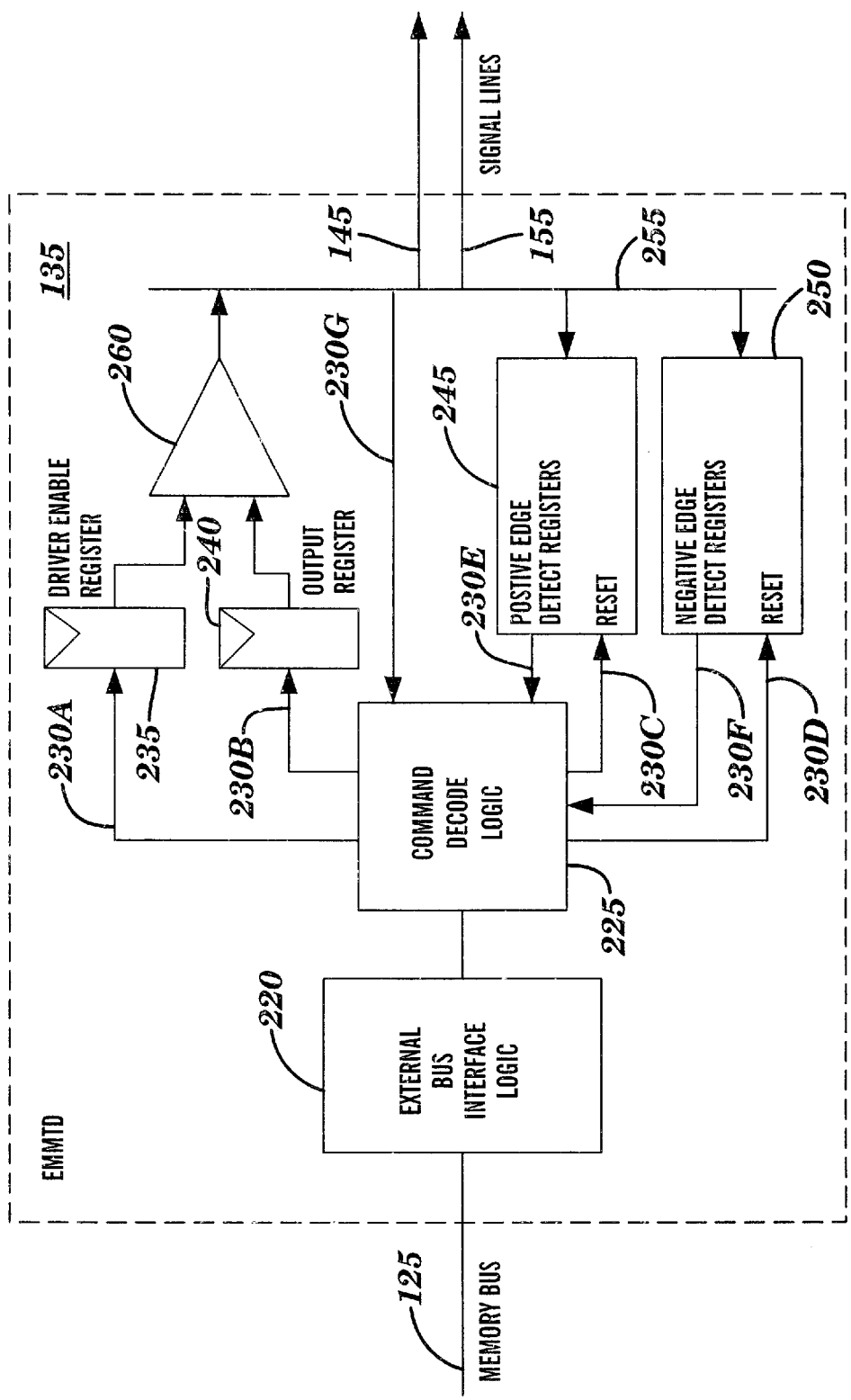
FIG. 4 illustrates the internal logic of the EMMTD of FIG. 1.

FIG. 4 illustrates the internal logic of the EMMTD of FIG. 1. EMMTD 135 includes an external bus interface logic 220 coupled to a command decode logic 225. Command decode logic 225 has outputs 230A and 230B coupled to driver enable register 235 and output register 240 respectively, and outputs 230C and 230D coupled to resets of positive edge detect register 245 and negative edge detect register 250 respectively, and has inputs 230E and 230F from the positive and negative edge detect registers respectively and input 230G from internal bus 255. Driver enable register 235 and output register 240 are coupled to the inputs of driver 260, which is coupled to the internal bus. External Bus interface 220 is coupled to memory bus 125 and internal bus 255 is coupled to signal lines 145 and 155 as illustrated in FIG. 1. For each bit on bus 255, units driver enable register 235, output register 240, driver 260 and positive and negative edge detect register 245 and 250 would be replicated.

As noted above, the EMMTD may be used for control and status monitoring of a core coupled to the EMMTD bi-directional bus in response to a test case being executed for SOC verification by a simulated embedded processor in the SOC. For example, because typically a UART handles asynchronous serial communication from an external source, a realistic way to simulate the operation of UART core 115 in a test case is to use an external driver core such as external driver core 140 to drive data to the UART. EMMTD 135 is used to trigger the external driver core 140 to begin driving the data. The representation is intended to include embodiments in any known form of logic design, including simulatable HDL modules and netlists, and physical implementations such as FPGAs or ASICs.

Figure 5:
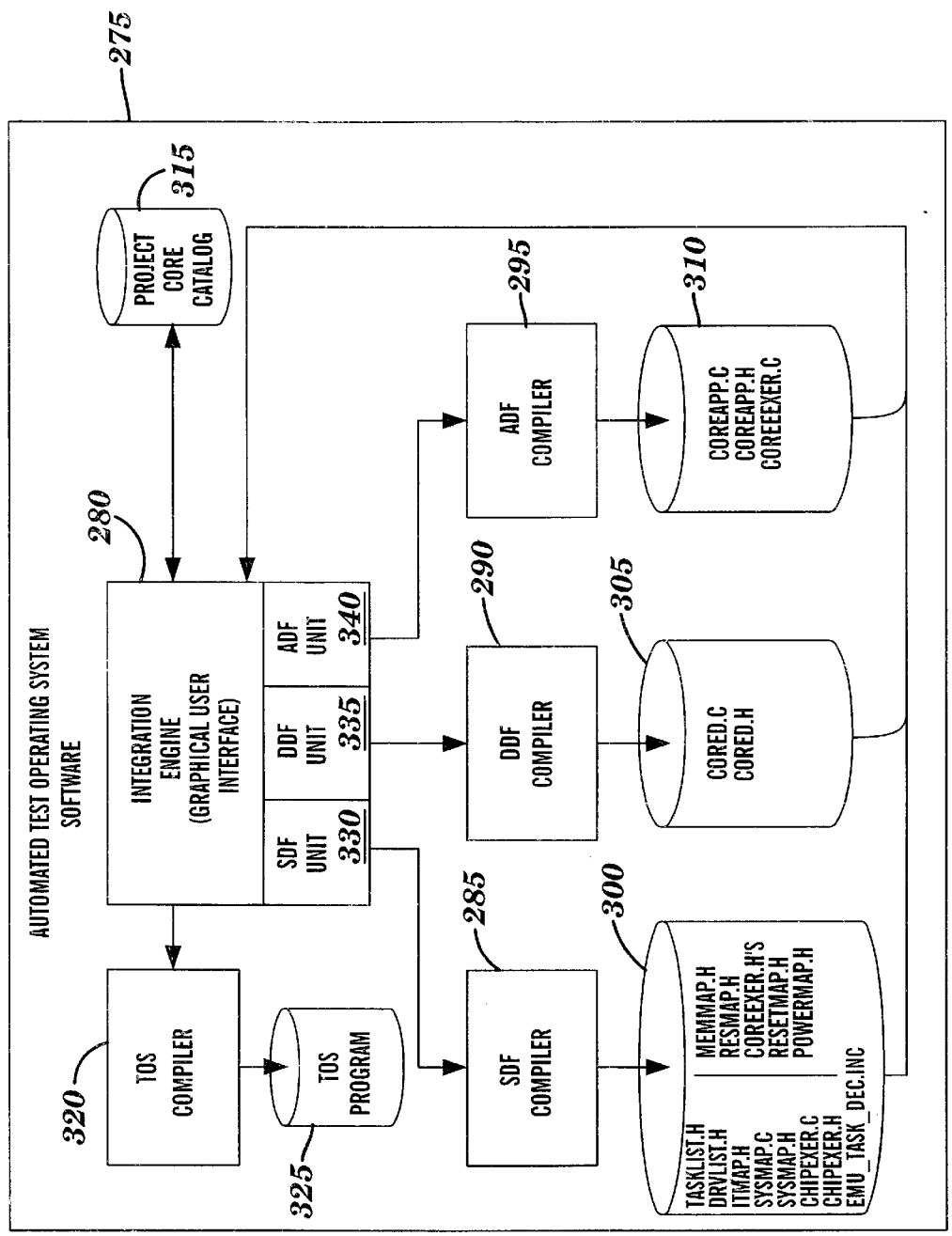
FIG. 5 illustrates the components of an automated TOS for design verification according to the present invention.

FIG. 5 illustrates the components of an automated TOS for design verification according to the present invention. In FIG. 5, an automated TOS 275 includes a integration engine 280, which is typically a graphical user interface (GUI) linked to a system-on-chip definition file (SDF) compiler 285 for generating SOC dependent files, a driver definition file (DDF) compiler 290 for generating low-level device drivers and an application description file (ADF) compiler 295 for generating test application files. DDF's and ADF's are SOC independent files. Test cases 155 illustrated in FIG. 1 and described above are comprised of compiled ADF's and compiled DDF's. Compiled SDF's are stored on a SDF storage media 300, compiled DDF's are stored on a DDF storage media 305 and compiled ADF's on a ADF storage media 310. Examples of compiled SDF, compiled DDF and compiled ADF files are shown. Automated TOS 275 also includes a project core catalog 315 and a TOS compiler 320, both linked to integration engine 280 containing un-compiled (text) DDF's, ADF's and SDF's. TOS compiler 320 generates TOS's 325. Integration engine 280 is also linked to SDF storage media 300, DDF storage media 305 and ADF storage media 310.

Integration engine 280 is used to create new and modify existing SDF's, DDF's and ADF's used by TOS compiler 320. Project core catalog 315 contains DDF's and ADF's for individual core designs. Integration engine 280 also allows selection of specific SDF's, DDF's and ADF's for use by TOS compiler 320 to create a TOS program 325 used to stimulate a simulation of an SOC design. An SDF section 330 of integration engine 280 enables a user to select from SDF storage media 300 files used to simulate the design to be verified. A DDF section 335 and an ADF section 340 of integration engine 280 enable a user to create or modify TOS applications drivers required to generate test cases. SDF, DDF and ADF sections 330, 335 and 340 are code generation wizards that automatically create tailored TOS templates. Code generation is not only used to create templates, it is iterative. Tests and interfaces are added, modified and deleted. SDF, DDF and ADF sections 330, 335 and 340 perform read-modify-write operation on source code according to user directives.

Figure 6:
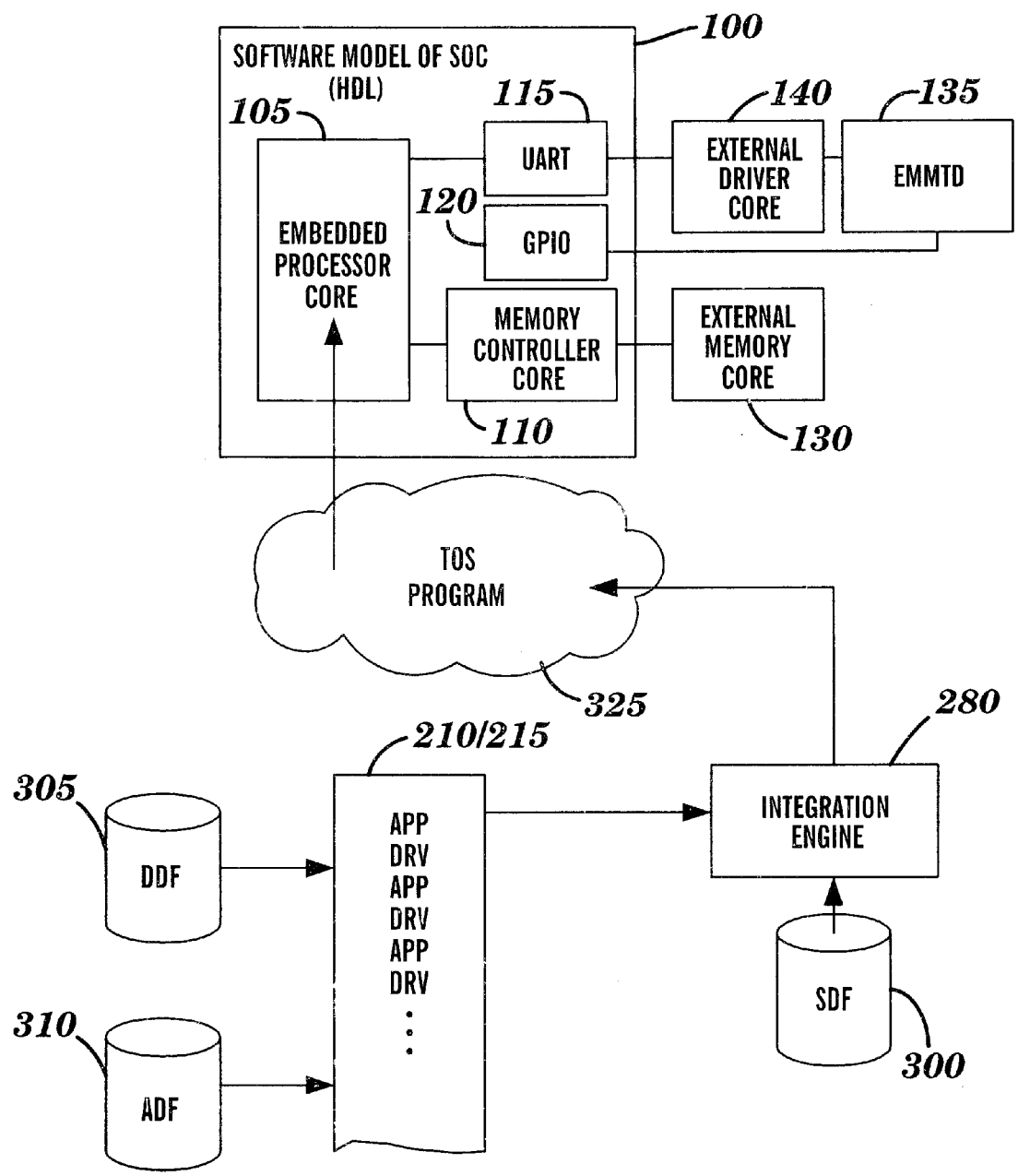
FIG. 6 illustrates schematically interaction between automated TOS 275 and SOC 100.

FIG. 6 illustrates schematically interaction between automated TOS 275 and SOC 100. In particular FIG. 6 illustrates that the operation of integration engine 280 is to create TOS program 325, which runs on, for example, an HDL simulation of an SOC. Selected from DDF storage media 305 and ADF storage media 310 are test application files and low-level device driver files 210/215 (as illustrated in FIG. 3 and described above.) test application files 210 and low-level-device driver files 215 are combined with selected SDF's from SDF storage media 300 by integration engine 280 to create TOS program 325 which is applied to a simulation of SOC 100. Additionally, external memory core 130, external driver 140 and EMMTD 135 may be also simulated and tested.

Figure 7:
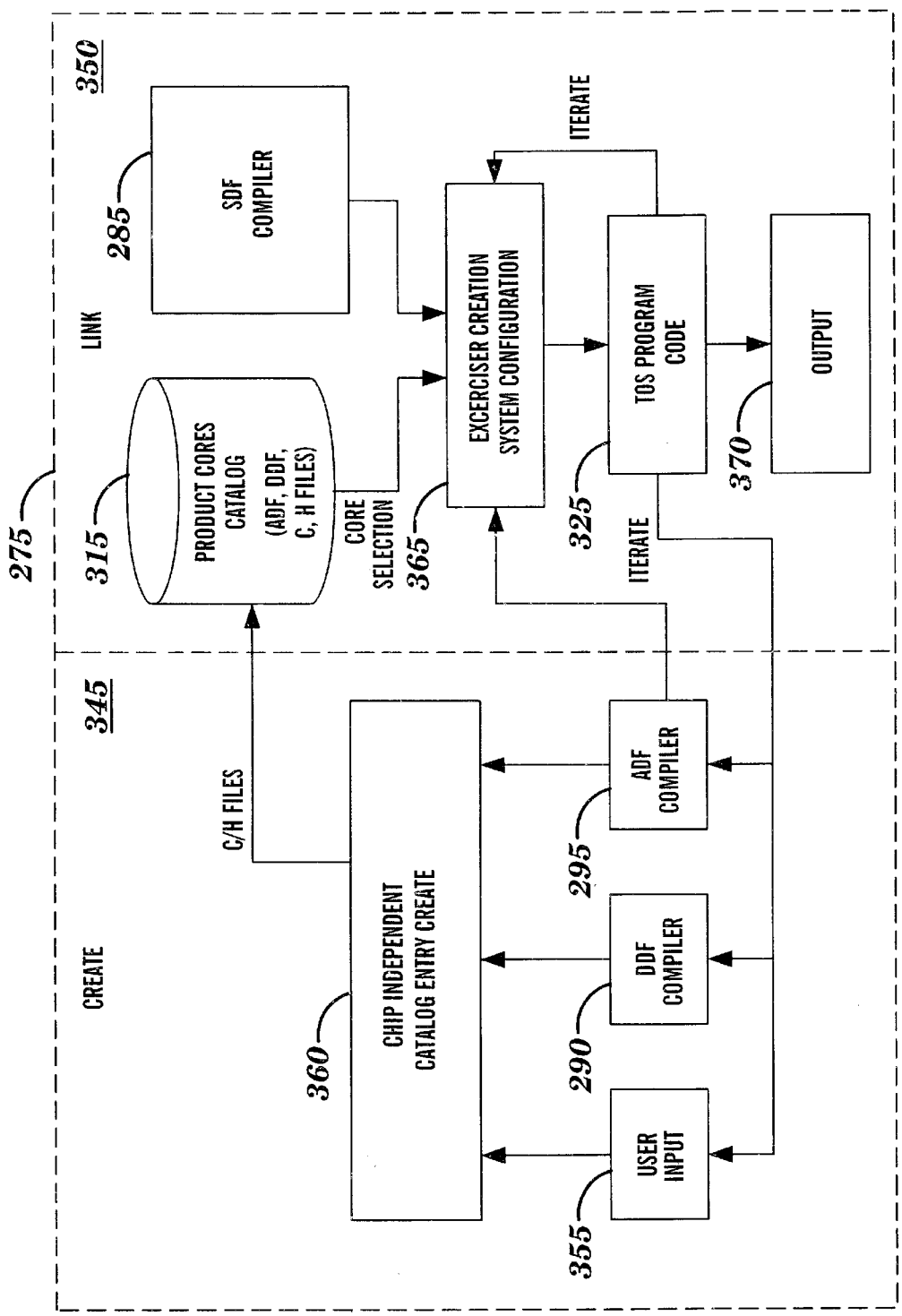
FIG. 7 is a schematic diagram of the functions of automated TOS 275.

FIG. 7 is a schematic diagram of the functions of TOS 275. In FIG. 7, automated TOS 275 includes a create function 345 and a link function 350. In create function 345, DDF compiler 290, ADF compiler 295 and user input 355 are used to create, in a first file create process 360, SOC independent files in project cores catalog 315. Project cores catalog 315 is a collection of reusable, chip independent software verification programs and their descriptions. Project cores catalog 315 is comprised of a multiplicity of "unit" cores. Unit core testcases are stored in the catalog in the form of ADF's, LLDD files and resulting High Level Language (HLL) files, for example, C code.

In link function 350, files from ADF compiler 295, project cores catalog 315 and SDF complier 285 are used to create, in a second file create process 365, SOC dependent files TOS programs 325. TOS programs include configuration files, and unit-exerciser files. Configuration files are generated from the SDF input, exerciser files are derived from SDF and ADF input, plus appropriate user HLL code required to enable unit-exerciser to run properly in the specific SOC.

When run, TOS programs 325 produce output 370, which is the result of the verification. Through integration engine 280, the user can modify TOS program 325 by iteration of second create step 365 as well as effect modification to DDF's and ADF's by iteration through DDF and ADF compilers 290 and 295.

This integration method allows users to combine chip-dependent configurations with chip-independent catalog entries, resulting in a complete chip verification executable program capable of exercising the chip. Chip exercising is a means of verification.

Chip development projects rely on the files stored in the project cores catalog 315 to quickly an efficiently "link" together the complete verification system required.

The chip-dependent integration, or link phase requires a description of the configuration of the SOC consisting of:

which cores to include in the SOC, the address map of the SOC for both core registers and memory regions, the interrupt configuration of the SOC, the mutual-exclusions (mutex) used in the SOC, power management and reset setups and chip-unique registers and testcases.

Automated TOS 275 supports rudimentary memory management for allocating and freeing memory blocks in the simulation memory in order for test programs and exercisers to access memory in the model without conflict and is accomplished by a file, MEMMAP.H to symbolically describe memory regions in the model. The memory management routines allocate "pages" of memory based on a described page size for the region.

TOS mutexes are constructs used to manage competing resources in a concurrent system. A mutex is assigned to a resource, and is allocated as needed prior to executing tests that utilize shared hardware. Mutex management routines allocate and free mutexes that are described in a file, RESMAP.H Automated TOS 275 supports multiple-instance (MI) test applications. The compilers described herein will generate code that conforms to the multi-instancing architecture. MI applications simply reuse their code, while instancing their static data structures.

These are two distinct but related kinds of instancing. Driver instancing refers to how many physical copies of a given core the driver is supposed to support in a given SOC.

Application instancing refers to how many simultaneous testcases can be executed, from a given test application, in a set of physical cores. The relationship between driver and test application instancing is one-to-one as long as there is one and only one "channel" in a physical core, that is, for every driver instance there is a corresponding test application instance. For cores that have more than one "channel" and for which the channels can operate simultaneously, the number of test application instances is a multiple of the number of driver instances as: A=C×P where C is the total number of channels on a physical core, P is the total number of physical cores in a system, and the result A is the total number of application instances that must be declared.

A specific application instance to operate on (application instance) must be determined by a device driver before doing an application callback when handling an interrupt as: L=(I×C)+CHANNEL, where I is the driver instance of the interrupt (passed as the MSG parameter in the interrupt handler invocation), CHANNEL is the interrupting channel number in the core (usually determined by reading the core) and the result L is the application instance APP_INSTANCE to operate on.

The application will obtain L or APP_INSTANCE either from a driver bits in a callback function (as described above), or by calling the TOS GET_MI_INSTANCE API when running base code. Once L is obtained, the core instance DRV_INSTANCE, and core channel DRV_CHANNEL is calculated as: core=L/C, and channel=L % C (L mod C). These parameters are subsequently used in driver calls.

In a one embodiment automated TOS 275 (described in the cross referenced application "Method of Developing Re-Usable Software for Efficient Verification of System-On-Chip Integrated Circuit Designs" Ser. No. 09/494,664), a set of description languages and related description compilers, and an integration engine is provided. The catalog is implemented as a set of files stored in a computer database. For the purposes of this description, the ANSI C programming language is used in all code samples.

The elements of the description languages determine the characteristics of the low-level drivers, the test applications, and the system configuration. DDF's are processed by DDF compiler 290, and the ADF's are processed by ADF compiler 295, generating "c" and "h" file templates. Manually generated test and device programming algorithms are included at designated sections of the templates (known as TODO sections), user input is not allowed outside the designated template sections. Therefore, there exists a close relationship between the contents of the description files and the complete driver or test application.

Integration, or linking, of reusable verification programs described with ADF and DDF files is accomplished by creation of a SDF files. The elements of the SDF are processed by SDF compiler 285, which generates the TOS components that specify the configuration of the system. The integration step, then, is a combination of collecting all dependencies denoted in the ADF and DDF files, and creating the SDF file and top-level exerciser files.

Driver Description Language

Driver description language is the specification tool for generating TOS device driver templates. It takes a DDF text file CORE.DDF as input and generates CORED.H and CORED.C. The proper driver name convention (appending "d") is automatically generated. DDF compiler 290 generates the proper code for installing driver interfaces (API's), interrupt handlers, callbacks, etc, that are standard constructs of a TOS driver. This leads to standardized, readable code for all TOS drivers written with the DDF compiler.

DDF files are constructed in sections, where section headers are coded in brackets ([ ]). The following section headers are parsed: [BEGIN]—required section, [INTERFACES]—declares functions (driver messages) that the driver will support, [INTERRUPT_HANDLERS]—installs the interrupt handler(s) for the driver, [REGISTER_OFFSETS]—declares symbols and values for registers in the driver's core, [PRINT_STRINGS]—defines strings displayable with TOS_PRINT from the driver code and [END]—required section.

[BEGIN]
    TITLE=Full Name String to Appear in the TIDE Catalog Window for this Core;
    CHANNELS_PER_CORE=1;
    [BEGIN] is a required section for the parser. TITLE= is a required keyword that provides a descriptive name of this core in the catalog, and has no effect on code generation. CHANNELS_PER_CORE= declares how many simultaneous channels exist in the core that an associated test application needs to be able to handle.

[INTERFACES]
    REGISTER_TEST(^RC);
    This section declares the driver functions that the driver will support. All functions will be given standard instance and return code members. Driver functions are used by the test applications to program and control associated core hardware. This section will automatically generate the DRIVER.H and DRIVER.C code to provide these functions in the driver. The following specific actions result from a driver function being placed in this section: a macro for invoking this function is added to the CORED.H file, all specified parameters are added to the CORE_MSG typedef, a #define associating a test string with a unique number is created in the CORED.H file to identify this driver function, this driver function is added to the message handling switch statement in the CORED.C file. This code segment includes comments to aid the driver function programmer in implementation of the function, the case statement, and a TODO: tag is installed to indicate to the driver writer where to put the code to actually do the work of the interface. and the name of the driver function is added to the CORED_INTERFACE_STRINGS array used by TOS_PRINT to format messages.

DDF compiler 290 will generate code that represents interfaces with the following convention: Interface names are specified in the DDF as in any case. The CORED.H file will create a corresponding macro as CORED_INTERFACE NAME ONE. The "case" statement generated in the CORED.C file will be all caps (CORED_INTERFACE) as will the #define message name in the CORED.H.

CORED.H file and create #defines for the specified registers. For example #define XYZ 0x20.

[PRINT_STRINGS]
    "Hello TOS Driver";
This section defines all strings used with TOS_PRINT when running this driver. All strings are enclosed in quotes, and are followed with a semi-colon. The string is placed in the CORED_PRINT_STRINGS array in the CORED.H file.
[END]
Required section for the parser.
An example of a DDF file is:
TOS Driver Standard Definition File

```
[BEGIN]
    TITLE=Example Driver;
    CHANNELS_PER_CORE=1;
[INTERFACES]
    Example_Interface(<unsigned char>ARG, ^rc);
[INTERRUPT_HANDLERS]
    Example_Interrupt,APPCALLBACK(0);
[REGISTER_OFFSETS]
    Example_REG = 0x12345678;
[PRINT_STRINGS]
    "Hello Example Driver";
[END]
```

Application Description Language

An application definition is a single text file (.adf) which, when compiled, produces or updates a test application, COREAPP.C and COREAPP.H and the associated exerciser file, COREEXER.C ADF compiler 295 generates the proper code for installing testcases (API's), application (and associated resources), callbacks, etc, that are standard constructs described in referenced application "Method of Developing Re-Usable Software for Efficient Verification of System-On-Chip Integrated Circuit Designs" Ser. No. 09/494,907. This leads to standardized, readable code for all TOS test applications written with ADF compiler 295.

ADF files are constructed in sections, where section headers are coded in brackets ([ ]). The following section headers are parsed: [BEGIN]—required section, [DRIVERS]—declares dependent device drivers, [TESTCASES]—declares testcase entries in the test application, [CALLBACKS]—declares test applications-callback functions to install, [PRINT STRINGS]—defines strings displayable with TOS_PRINT from the application code and [END]—required section
[BEGIN]
    TITLE=Full Name String to Appear in the TIDE Catalog Window for this Core;
    CHANNELS PER CORE=1;
Required section for the parser. This section sets basic parameters for the application and exerciser. TITLE= is a keyword that the catalog will use to present a descriptive name of this core, and has no effect on code generation, but must be the same as the TITLE of the associated DDF file. CHANNELS_PER_CORE declares how many simultaneous channels exist in the core that the test application needs to be able to handle. This number is used to calculate the proper context of the multi-instance application, and how many instances must be instantiated in the system.
[DRIVERS]
    MYDRIVERD;
This section installs the includes for the specified drivers as #INCLUDE MYDRIVERD.H, etc. Driver information is used to assure the proper drivers are instantiated in the system.
[TESTCASES]
These sections allows declaration of the actual testcase names and begins a section to describe them according to the following syntax:
    TEST=TESTNAME1, TESTNAME2;.
Specifies a set of testcases. All subsequent commands in the ADF pertain to these testcases until another TEST= or the end of the [TESTCASES] section is determined. Repeating testcase names declared here will all have the exact same resources and CASE statements generated in the test application and exerciser files. The possible parameters under a test specification are as follows. All testnames are generated into the code files in upper case.
    UNCOOPERATIVE; or COOPERATIVE;
Declares the class type of the testcase(s) This is used to generate the APPEXER.H testcase list file.
    PARMS=PATTERN;
This keyword declares any parameters associated with the testcases in this section. All parameters are added to the message structure for the test application.
    RESOURCES=
Declares all resources required to run the testcases in this section. Resources are declared by name and are grouped using the "{ }" block syntax, where each resource block is delimited by a comma and the entire RESOURCES declaration is delimited by a semicolon. All resources declared here result in an allocation in the exerciser STARTING_FUNCTION and a parameter installation into the application message structure. All allocated resources are freed in the exerciser ENDING_FUNCTION template. The following resources can be specified:
    EMMTD {ename(n), ename(n), . . . }
Declares a group of emmtd names, and the number of contiguous bits of emmtd that will be required. Example: EMMTD{XDMA(4),IDMA(8)} declares that SDF (and the testbench) must include xdma and idma, and reserve four and eight bits of emmtd respectively. Example code to access these symbols as: XDMA_EMMTD_BASES and IDMA_EMMTD_BASES is installed into the application template. Coders refer to the example syntax to generate real EMMTD driver calls.
    MEMORY {address_var(ANY or specific REGION-NAME, byte-length, alignment), . . . }
Declares memory allocation requests. Each request creates a variable ADDRESS_VAR that will contain the address of the allocation, and is generated into the test application message structure, so it can be passed to the test application. The memory handle is automatically generated into the exerciser instance data, and is completely controlled by the generated exerciser code, so there is no user manipulation of the memory handle required. The keyword ANY generates RND_ALLOCATE, or a specific region is declared to generate TOS_ALLOCATE. The following types are permissible in the REGION-NAME: "ANY", a specific region name, or a user-variable which must be set during the pre-test TODO: block of the resulting APPEXER.C file.

As previously stated, mutexes are the resource allocation mechanism used in TOS for elements other than system memory. All shared elements in the SOC must be assigned to a mutex, and allocated, to avoid conflicts when running concurrent test applications. All mutex allocation and freeing is done in an application exerciser. Some mutexes, (those defined in the ADF) refer to resources that are part of a core, and must be shared by test applications and which may be running concurrently. An example previously referred to is a DMA core that supports multiple data transfer channels. In the present implementation example, these channels are shared by test applications that may use any channel to perform the verification test. The existence of channels is known to the application test, and must be allocated and freed to ensure that other tests (or another copy of the same test) do not try to use the same channel at the same time. ADF-based mutexes are therefore defined when the application code is developed, and appear in the ADF at that time. Other shared facilities arise when a SOC is defined. An example of a SOC defined mutex arises when a pin sharing core is used to connect multiple cores to the same set of chip pins. Since only one of the cores sharing a set of pins may be functional at a point in time, the pin sharing core must be configured to connect the core under test for the duration of the test, and all other cores which use the common pins must be prevented from running. A mutex is used to communicate the fact that the pin sharing core has been programmed, and other tests must wait until the test which has allocated the mutex has completed. SDF-based Mutexes" are system-based mutexes, and are not known to the application at the time the test application is written. SDF-based mutexes are created by the system integrator at the time the chip is developed to mututally exclude apps from running concurrently. Since ALL mutexes are allocated by the coreexer, both ADF-based and SDF-based mutexes are processed by ADF compiler 295 to generate exerciser code, where allocation and freeing are done.

MUTEX=

Declares all mutex resources that are required by the application to run. ADF-based mutexes result in a message structure variable so the application can know the actual value of the allocated mutex. An example of an ADF-based mutex is a DMA_CHANNEL. In this case, the application MUST KNOW the allocated channel (although it doesn't care which channel) to operate correctly. Therefore, ALL ADF-based mutex allocations are known to the application. The syntax of a ADF-based mutex is as follows:

MUTEX_NAME{variable_name_a(ANY or value), variable_name_b(ANY or value), . . . }, ANOTHER_MUTEX_NAME{variable_name_c (ANY or value), VARIABLE_NAME_D (ANY or value), . . . };

The code generated for this testcase in the exerciser will assure that the mutex is allocated, assigned and freed. The permissible entries into a mutex value are: ANY, a decimal/hex number, "exer_instance", or a user-variable, which must be set during the pre-test TODO: block of the resulting appexer.c file.

[CALLBACKS]

Installs the specified application callback handlers. If the keyword SETCONTEXT is specified, the application instance calculation is installed and the context pointer is setup. If the keyword REGISTERWITH is specified, then the callback handler registration code is automatically generated in the test application in the one-time initialization code section.

[PRINT_STRINGS]

"Hello TOS Application";

This section defines all strings used with TOS_PRINT when running this application. All strings are enclosed in quotes, and are followed with a semi-colon.

[END]

Required section for the parser.

An example of a DDF file is:

```
[BEGIN]
    NAME=Example Application/Exerciser;
    CHANNELS_PER_CORE=1;
    TIMEOUT=10;
[DRIVERS]
    BOBD;
[TESTCASES]
    TEST=Example_Test;
        COOPERATIVE;
        PARMS=<unsigned short>PATTERN;
        YIELDLOOP=xfer_complete;
        RESOURCES=
            EMMTD{xdma (4)},
            MEMORY{buffer1(FOO,4096,16),buffer2(ANY,16,1)
            };
        MUTEX=
            DMA_CHANNELS{channel(ANY)};
[CALLBACKS]
    Example_Callback, SETCONTEXT,REGISTERWITH(BOBD:0);
[PRINT_STRINGS]
    "Hello Example Application";
[END]
```

System Description Language

A system definition is a single text file (.SDF)which, when compiled, produces a set of chip specific configuration files. The goal of the SDF is to describe, architecturally, the nature of the SOC to be verified with automated TOS 275. The description includes information such as: what test applications are needed, how many instances of them, and whether to run tests in them or not, what device drivers are needed, how many cores will they support, the base address of each core, and the interrupt configuration of the core, and EMMTD requirements of the tester software system, the system memory map and the system mutexes.

This information is provided to SDF compiler 285, and TOS programs 325 are generated. These resulting files are not user editable, and are completely regenerated each time SDF compiler 285 is run. Therefore, system description edits are confined to the SDF itself.

SDF compiler 285 creates a text file (.CPL file) that contains the list of files (generated or otherwise) that will need to be compiled by the C-compiler to create executable TOS program 325. The CPL file categorizes the compilation files as a system file, a core file or a SOC file.

SDF files are constructed in sections, where section headers are coded in brackets ([ ]). The following section headers are parsed: [BEGIN]—sets exerciser global configuration parameters, [APPS]—declares and configures test applications, [DRIVERS]—declares and configures drivers, [EMMTD]—declares EMMTD symbols and assignments, [MEMORY]—declares and configures the memory regions,

[MUTEX]—declares all of the mutexes required in the system, [EMU_SMM]—locates the EMU and other kernel related models,[MISC_REGS]—declares miscellaneous registers for chip glue to be specified in the SYSMAP.H, [EXERCISER_STRINGS]—declares the strings that will be indexed by TOS_PRINT statements from the master task, [DERIVED_CHIP_TESTCASES]—allows creation of testcases that are chip specific which are based upon generic application testcases, [TESTLISTS]—declares all the testcase lists that will be available to exercise in the system, [USETABLES]—specifies the USE or DON'T use status of multiple instance exercisers and specifies the exact testlist names to be executed for uncooperative and cooperative tests if an instance is to be used and [END]—required section.

[BEGIN]
    MASTER_PRIORITY=HIGH; # must specified for priority-scheduling versions of TOS, can't be for other versions
    STOPONERROR; # exerciser stops on first error occurrence when defined
    TESTCASE_LIMIT=100; # exerciser won't run any more testcases than this These parameters control how the exerciser will run testcases. This section writes into CHIPEXER.H.

[APPS]
    UICAPP,PRIORITY=LOW,UNCOOP=DONTRUN, COOP=RUNLIST;

This section will install test applications into the system. Test applications are capable of multi-instancing and states the number of instances to install. The relative execution priority of the application is specified as HIGH, MEDIUM or LOW using PRIORITY=. The run state of an test application (uncooperative and cooperative) is declared. The following syntax is allowed for setting the runlist state: DR or DONTRUN—means do not pick any tests from this list, RL or RUNLIST—pick tests sequentially, the stop picking after the last one, RF or RUNFOR—pick test sequentially, loop to the first one after the last one and RR or RANDOM—pick tests at random from the list.

For uncooperative tests, the only possibilities are DR or RL.

---

[DRIVERS]
    UICD,BASE=0xC0;
    MEMORYD;
    UARTD,BASE=0xEF600300,INT=13(UARTD_INTERRUPT, ENABLED,NONCRITICAL,POSITIVE,EDGE);
    UARTD,BASE=0xEF600400,INT=17(UARTD_INTERRUPT, ENABLED,NONCRITICAL,POSITIVE,EDGE);
    XINTD, INT=0(XINTD_INTERRUPT,ENABLED, NONCRITICAL,POSITIVE,EDGE);
        ADDINT INTD,INT=1(XINTD_INTERRUPT,ENABLED, NONCRITICAL, POSITIVE,EDGE);

---

This section installs and configures the listed drivers. Various combinations of parameters are allowed depending on the requirements of the driver. Most drivers are servicing a hardware core and will have a base address associated with that core. Some (like MEMORYD) do not, so no base is declared. Drivers that service cores with interrupts connected to them declare the interrupt number and required interrupt parameters. The first parameter within the parentheses is the HANDLER function that is in the device driver to handle the interrupt. Multiple interrupts connected to a single core, and thus an given instance of the device driver, are added to the driver by using the ADDINT keyword. ADDINT allows an interrupt to be added to an already declared device driver.

Multiple instances of drivers (to service multiple instances of physical cores) are declared simply by declaring the driver more than once, as with the UART example above. Instances are installed the order that they are encountered in the SDF, so, in this case, UART instance zero has a base address of 0xEF600300 and is assigned to interrupt 13, and UART instance one has a base of 0xEF600400, and is hooked to interrupt 17. The possible keywords that control interrupts are, exactly one from each type must be used: ENABLED or DISABLED, CRITICAL or NONCRITICAL, POSITIVE or NEGATIVE and EDGE or LEVEL

[EMMTD]
    xdma=0x11;
    xdma=0x12;

This section declares the EMMTD symbols that are required by the specific test applications and sets the symbols in the EMMTD for a specific tester software. This string is appended with the standard EMMTD_BASES string (XDMA_EMMTD_BASES) to be consistent with the ADF naming convention.

[MEMORY]
    HSPLBMC_SDRAM alias0_bank0,BASE= 0x00000000,SIZE=100, PAGESIZE=20, RNDPICK= FALSE;
    EBC_FLAT,BASE=0xFFF00000,SIZE=1048576, PAGESIZE=16384,
    RNDPICK=TRUE;

This section declares the memory regions defined in the system. The memory region name is defined, followed by a physical base address, a size in bytes, and a page size. The parameter "RNDPICK" declares if the memory region is accessible to TOS program 325 RND_ALLOCATE functions or not.

[MUTEX]
    DMA_CHANNELS (4); # mutexes declared in at least one ADF file
    GPIO_BOUNDARY_BITS(32), # these are imposed on this chip
    USEDWITH:
        GPIOAPP(0) {INPUT_TEST,OUTPUT_ TEST}{0–4,7,9},
        GPIOAPP(1) {ALL}{0–4,7,9};

This section declares the mutexes defined in the system. The mutex name is defined, followed by a number of units. In this example, two mutexes are defined: DMA_CHANNELS has 4 units, GPIO_BOUNDARY_BITS has 32 units.

For mutexes that are declared in ADF files (like DMA_CHANNELS), the SDF must instantiate a corresponding mutex to satisfy the application. In addition, chip specific mutexes can be created, and assigned, or USEDWITH specific applications and testcases. Such mutexes are not known at the time the applications are created. An example is GPIO_BOUNDARY_BITS.

[EMU_SMM]
    # EMU/SMM takes 64K of address space
    BASE=0xB810; # High 16 bits of the EMU/SMM address space, in hex.

This section locates the EMU and the SMM (split mode model, when available) in the memory address space. The EMU and SMM require 64K bytes so this defines the upper 16-bits of address only. EMU and SMM are described in referenced application "Method of Developing Re-Usable Software for Efficient Verification of System-On-Chip Integrated Circuit Designs" Ser. No. 09/494,907.

[MISC_REGS]
    MISC0=0x12345678;
    MISC1=0xABCDEF0;
    This section defines any miscellaneous registers that need to be used in the system. Typically, these are glue logic registers, and registers that are not associated with any particular core, and are chip unique. SDF compiler 295 will #define these values in the SYSMAP.H file directly from the strings in the section.
[EXERCISER_STRINGS]
    "Hello TOS Exerciser";
    This section defines all strings used with TOS_PRINT when running the master task.

---
[DERIVED_CHIP_TESTCASES]
    UART_SET_MODEM_TEST_2_OUT=UARTAPP
    (UART_SET_MODEM_TEST_O);
---

This section assigns new chip specific testcases to existing application tests. Derivation allows chip specific tests to be defined that utilize the general application tests, expressed as a new test.

---
[TESTLISTS]
    UICAPP,LIST_UN={TEST1,TEST2};
    UICAPP,LIST_CO={TEST1,TEST2)};
    DMAAPP,LIST_XYZ{BYPASS,TEST3};
---

This section allows chip verifiers to specify what testcases are to be selected in a given compile of TOS. This data is used in conjunction with the RUN/DONTRUN selection in the application installation section ([APPS]) of the SDF, where the first-level decision about executing any tests in an application is made. Once an application is selected to run, this section determines what testcases will run. A further "USETABLE" additionally determines what will run a particular instance of the test application. The testlists and uselists are added to the COREXER.H file.

---
[USETABLES]
    UICAPP(1)={COOPERATIVE_LIST,
    UNCOOPERATIVE_LIST};
    DMAAPP(3)=LIST_UN,LIST_CO};
---

This section allows chip verifiers to specify exactly what specified testlist will be run against a desired instance of an test application. A USETABLE entry specifies two lists, one for uncooperative tests, and one for cooperative tests, in that order. The instance of the test application to apply the tests to is specified as the number —(1)—in the uicapp example.
[END]
    Required section for the parser.
An example of an SDF file is
Example "TOS System Description Language File" (.SDF)

---
[BEGIN]
    MASTER_PRIORITY=HIGH;
    STOPONERROR; # exerciser stops on first error occurence when DEFINED
    TESTCASE_LIMIT=100; # exerciser won't run anymore tescases than this
Include Apps. Set All to DONTRUN.
[APPS]
    UICAPP,INSTANCES=2,PRIORITY=LOW,UNCOOP=DR,
    COOP=DR;
    CPMAPP,PRIORITY=LOW,UNCOOP=DR,COOP=DR;
    DMAAPP,INSTANCES=4,PRIORITY=LOW,UNCOOP=DR,
    COOP=DR; # 4
    per core, 1 core in the chip
    UARTAPP,INSTANCES=2,PRIORITY=LOW,UNCOOP=DR,
    COOP=DR;
    MEMAPP,PRIORITY=LOW,UNCOOP=DR,COOP=DR;
Include Drivers.
[DRIVERS]
    UICD,BASE=0xC0;
    EMMTDD,BASE=0xB8200000;
    CPMD,BASE=0xB0;
    HSDMAD,BASE=0x100,INT=4(HSDMAD_INT_CHANNEL0,
    ENABLED,NONCRITICAL,POSITIVE,EDGE);
        ADDINT
    HSDMAD,INT=5(HSDMAD_INT_CHANNEL1,ENABLED,
    NONCRITICAL,POSITIVE,EDGE);
    UARTD,BASE=0xEF600300,INT=11(UARTD_INTERRUPT,
    ENABLED,NONCRITICAL,POSITIVE,EDGE);
    UARTD,BASE=0xEF600400,INT=13(UARTD_INTERRUPT,
    ENABLED,NONCRITICAL,POSITIVE,EDGE);
    MEMORYD;
Declare EMMTD Assignments.
[EMMTD]
    xdma=0x11;
    xdma=0x12;
    uart=0x00;
    uart=0x07;
Declare All Memory Regions found in ADF's, creates memmap.h
[MEMORY]
    HSPLBMC_SDRAM_alias0_bank0,BASE=0x00000000,
    SIZE=134217728,
    PAGESIZE=8388608,RNDPICK=FALSE;
    EBC_FLAT,BASE=0xFFF00000,SIZE=1048576,
    PAGESIZE=16384,RNDPICK=TRUE;
Declare Resources, creates resmap.h
[MUTEX]
    DMA_CHANNELS(4); # mutexes declared in at least one ADF file
    GPIO_BOUNDARY_BITS(32), # these are imposed on this chip
        USEDWITH:
            GPIOAPP(0){INPUT_TEST,OUTPUT_TEST}
            {0–4,7,9},
            GPIOAPP(1){ALL}{0–4,7,9};
Declare EMU and SMM base address.
[EMU_SMM]
EMU/SMM takes 64K of address space
    BASE=0xB810; # High 16 bits of the EMU address space, in hex.
Declare Miscelleneous Registers and Offsets. End up in sysmap.h file.
[MISC_REGS]
    MISC0=0x1234;
    MISC1=0xaaaa;
[EXERCISER_STRINGS]
    "Starting Uncooperative Tests";
    "Ending Unciooperative Tests";
    "Starting Cooperative Tests";
    "Ending Cooperative Tests";
#####################################
From Here Down: These sections control what testcases to run and in
what instances to run them.
#####################################
[DERIVED_CHIP_TESTCASES]
    UART_SET_MODEM_TEST_2_OUT=UARTAPP
    (UART_SET_MODEM_TEST_O);
    UART_SET_MODEM_TEST_2_IN=UARTAPP
    (UART_SET_MODEM_TEST_I);
testlists and usetables generate the proper coreexer.h file.

```
-continued

[TESTLISTS]
    UICAPP,LIST_UN={TEST1(associated file),TEST2};
    UICAPP,LIST_CO={TEST1,TEST2};
    DMAAPP,LIST_XYZ{BYPASS,TEST3};
[USETABLES]
# sets proper table to "USE" if it's here, all others set to
"DONTUSE"
    UICAPP(0)={LIST_UN,LIST_CO};
    DMAAPP(1)={LIST_XYZ,LIST_XYZ};
[END]
```

Additionally, the following SOC-specific TOS program 325 files are generated by SDF compiler 285: TASKLIST.H—tasks (test applications) for a specific SOC, DRVLIST.H—LLDD's used for a specific SOC, CHIPEXER.C/H—SOC exerciser, CHIPINIT.C—SOC initialization sequence, INTMAP.H—SOC interrupt configuration, SYSMAP.C/H—SOC register address and core instance configuration, MEMMAP.H—SOC memory configuration, RESMAP.H—SOC mutex (resource allocation) configuration.

Figure 8:
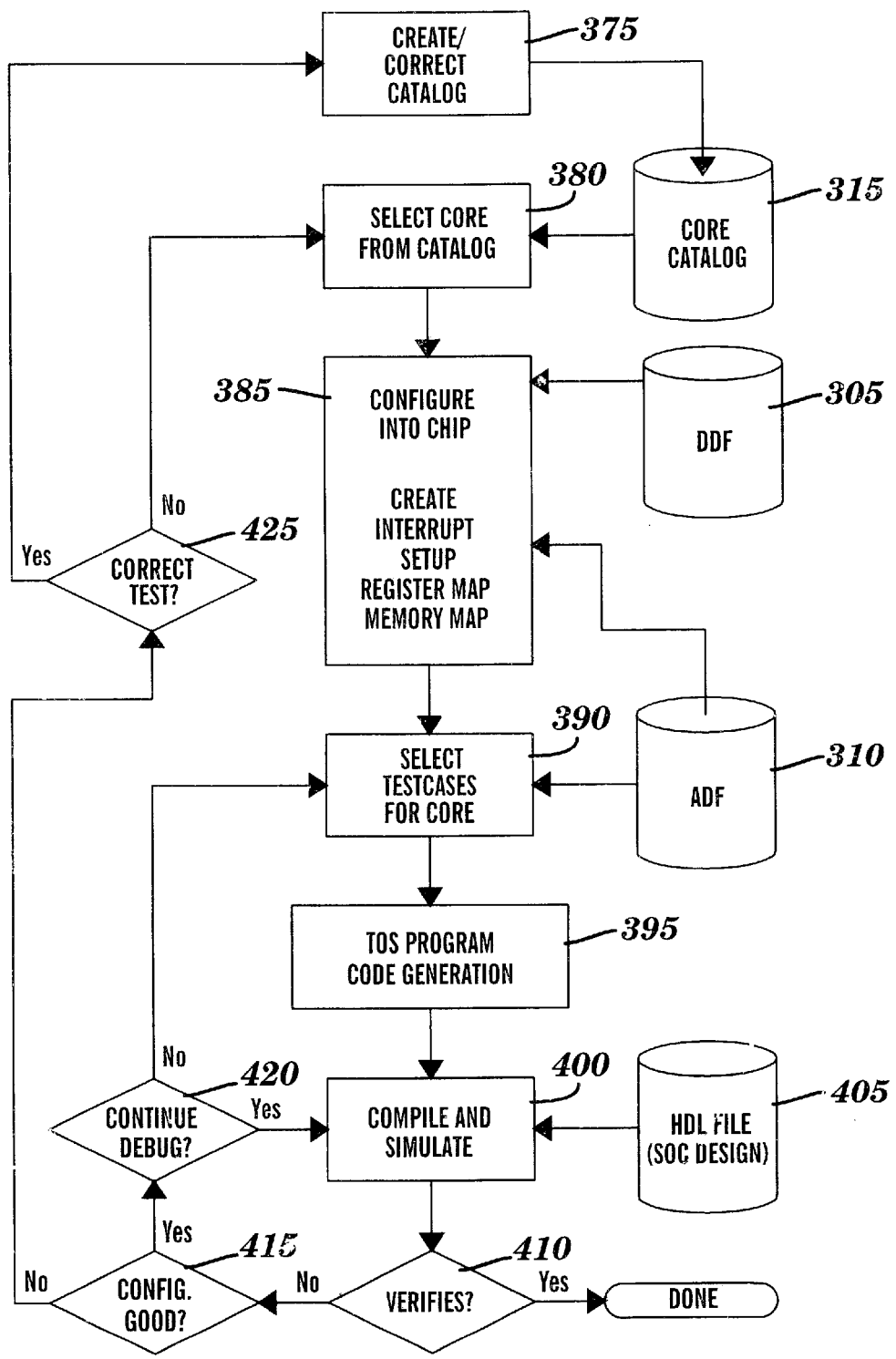
FIG. 8 is a flowchart of the method of automating system-on-chip-integrated circuit design verification according to the present invention.

FIG. 8 is a flowchart of the method of automating system-on-chip-integrated circuit design verification according to the present invention. In step 375, product core catalog 315 is created or existing entries updated. In step 380, cores are selected from product core catalog 315. In step 385, the cores selected in step 380 are configured into an SOC using DDF's from DDF storage media 305 and ADF's from ADF storage media 310 and the interrupts, register map and memory map files created. In step 390, testcases for each core (ADF'S) are selected from ADF storage media 310. In step 395 TOS program 325 is created by TOS complier 320. In step 400, TOS program 325 is compiled into machine language and the simulation (verification) run on an HDL file defining the SOC design from HDL storage media 405. In step 410, the results of the simulation are checked. If the SOC verifies then the method is complete. If the SOC does not verify then in step 415, the SOC configuration is checked. If the SOC configuration is good then in step 420 a decision is made to continue debug of TOS program 325. if the decision is to continue debug, the method loops to step 400, otherwise the method loops to step 390 where different ADF's are selected. If in step 415, the SOC configuration is not good then the method proceeds to step 425. In step 425, a check of the testcases is made. If the testcase is correct then the method loops to step 380 otherwise the method loops to step 375.

Figure 9:
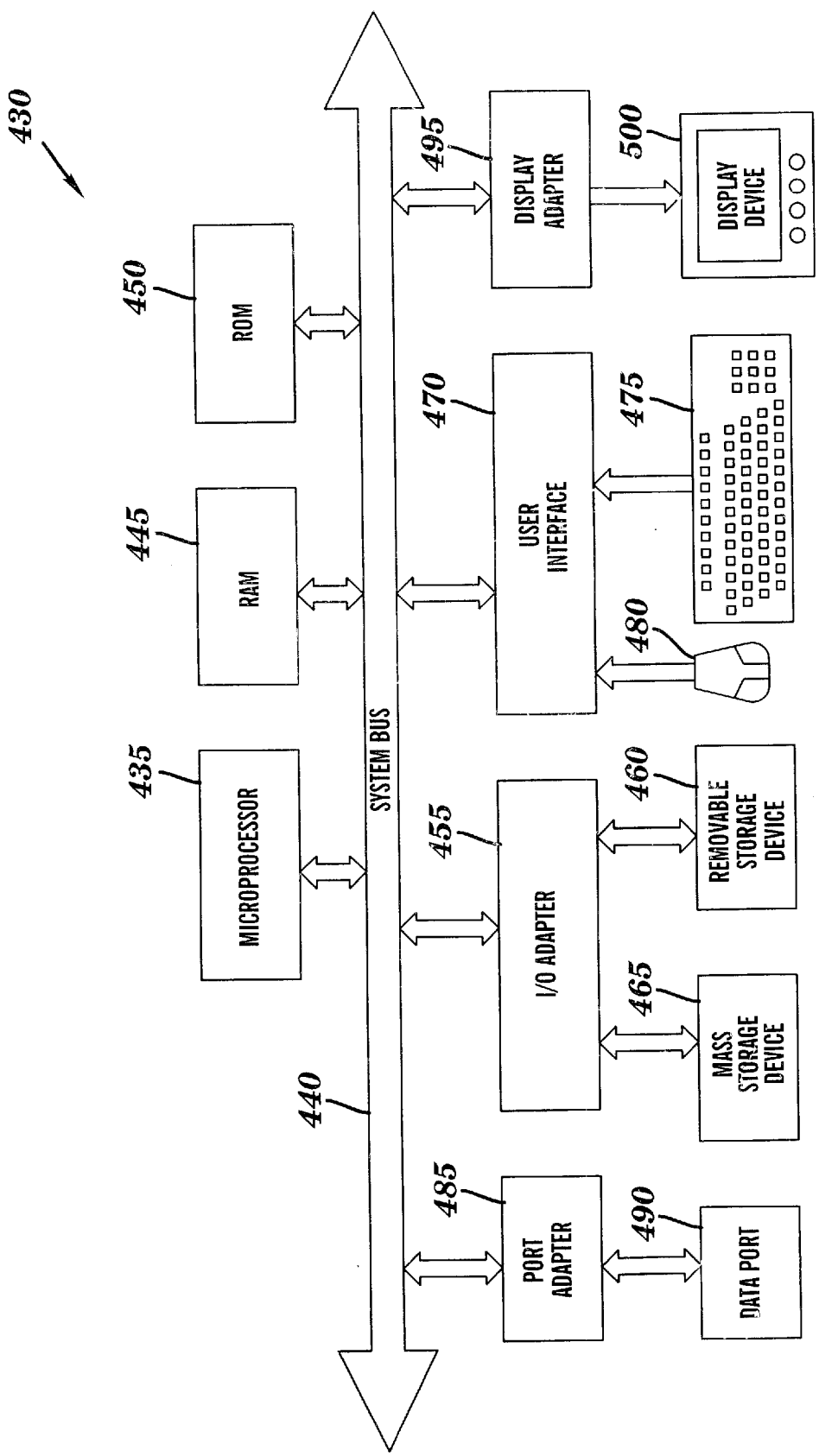
FIG. 9 is a schematic block diagram of a general-purpose computer for practicing the present invention.

Generally, the method described herein with respect to automated design verification of an SOC is practiced with a general-purpose computer and the method may be coded as a set of instructions on removable or hard media for use by the general-purpose computer. FIG. 9 is a schematic block diagram of a general-purpose computer for practicing the present invention. In FIG. 9, computer system 430 has at least one microprocessor or central processing unit (CPU) 435. CPU 435 is interconnected via a system bus 440 to a random access memory (RAM) 445, a read-only memory (ROM) 450, an input/output (I/O) adapter 455 for a connecting a removable data and/or program storage device 460 and a mass data and/or program storage device 465, a user interface adapter 470 for connecting a keyboard 475 and a mouse 480, a port adapter 485 for connecting a data port 490 and a display adapter 495 for connecting a display device 500.

ROM 450 contains the basic operating system for computer system 430. Examples of removable data and/or program storage device 460 include magnetic media such as floppy drives and tape drives and optical media such as CD ROM drives. Examples of mass data and/or program storage device 465 include hard disk drives and non-volatile memory such as flash memory. In addition to keyboard 475 and mouse 480, other user input devices such as trackballs, writing tablets, pressure pads, microphones, light pens and position-sensing screen displays may be connected to user interface 470. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 460, fed through data port 490 or typed in using keyboard 475.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of verifying the design of an integrated circuit chip comprised of one or more cores, comprising:
    creating a project core catalog comprising driver description files and application description files for each core;
    creating a system definition file for said integrated circuit chip;
    inputting said driver description files, said application description files and said system definition files into a code generator, said code generator outputting a test operating system test code; and
    applying said test operating system test code to a software simulation of said integrated circuit chip to perform design verification.

2. The method of claim 1, wherein said driver description files and application description files are non-integrated circuit specific and said system definition file and said test operating system test code are integrated circuit specific.

3. The method of claim 1, further including the step of modifying one or more of said driver description files, said application description files and said system definition files in response to results of said design verification.

4. The method of claim 1, further including:
    generating off chip driver description files and off chip application description files for off chip cores; and
    including said off chip cores and an external memory mapped test device in said system definition file.

5. The method of claim 1, further including the step of selecting driver definition files and application definition files from said project core catalog to be inputted into said code generator based on a set of cores comprising said integrated circuit chip.

6. The method of claim 1, wherein said driver definition files includes code supporting one or more operations selected from the group consisting of declaring functions the driver will support, installing interrupts, declaring symbols and values for registers in the drivers core and defining displayable print strings.

7. The method of claim 1, wherein said application definition file includes code supporting one or more operations selected from the group consisting of declaring driver devices, declaring testcases for test applications, declaring test application callbacks and defining displayable print strings.

8. The method of claim 1, wherein said system definition file includes code supporting one or more operations selected from the group consisting of declaring and configuring test applications, declaring and configuring drivers, declaring external memory-mapped test device symbols and assignments, declaring and configuring memory regions, declaring mutexes, declaring registers, declaring exerciser strings, creation of testcases, declaring testcases, and specifying status of multiple instances of the same test application.

9. A program storage device readable by machine, tangibly embodying a program of instructions executable by the machine to perform method steps for verifying the design of an integrated circuit chip comprised of one or more cores said method steps comprising:

creating a project core catalog comprising driver description files and application description files for each core;

creating a system definition file for said integrated circuit chip;

inputting said driver description files, said application description files and said system definition files into a code generator, said code generator outputting a test operating system test code; and applying said test operating system test code to a software simulation of said integrated circuit chip to perform design verification.

10. The program storage device of claim 9, wherein said driver description files and application description files are non-integrated circuit specific and said system definition file and said test operating system test code are integrated circuit specific.

11. The program storage device of claim 9, further including the step of modifying one or more of said driver description files, said application description files and said system definition files in response to results of said design verification.

12. The program storage device of claim 9, further including:

generating off chip driver description files and off chip application description files for off chip cores; and including said off chip cores and an external memory mapped test device in said system definition tile.

13. The program storage device of claim 9, further including the step of selecting driver definition files and application definition files from said project core catalog to be inputted into said code generator based on a set of cores comprising said integrated circuit chip.

14. The program storage device of claim 9, wherein said driver definition files includes code supporting one or more operations selected from the group consisting of declaring functions the driver will support, installing interrupts, declaring symbols and values for registers in the drivers core and defining displayable print strings.

15. The program storage device of claim 9, wherein said application definition file includes code supporting one or more operations selected from the group consisting of declaring driver devices, declaring testcases for test applications, declaring test application callbacks and defining displayable print strings.

16. The program storage device of claim 9, wherein said system definition file includes code supporting one or more operations selected from the group consisting of declaring and configuring test applications, declaring and configuring drivers, declaring external memory-mapped test device symbols and assignments, declaring and configuring memory regions, declaring mutexes, declaring registers, declaring exerciser strings, creation of testcases, declaring testcases, and specifying status of multiple instances of the same test application.

17. A computer system comprising a processor, an address/data bus coupled to said processor, and a computer-readable memory unit coupled to communicate with said processor, said memory unit containing instructions that when executed implement a method for verifying the design of an integrated circuit chip comprised of one or more cores, said method comprising the computer implemented steps of:

creating a project core catalog comprising driver description files and application description files for each core;

creating a system definition file for said integrated circuit chip;

inputting said driver description files, said application description files and said system definition files into a code generator, said code generator outputting a test operating system test code; and applying said test operating system test code to a software simulation of said integrated circuit chip to perform design verification.

18. The computer system of claim 17, wherein said driver description files and application description files are non-integrated circuit specific and said system definition file and said test operating system test code are integrated circuit specific.

19. The computer system of claim 17, further including the step of modifying one or more of said driver description files, said application description files and said system definition files in response to results of said design verification.

20. The computer system of claim 17, further including:

generating off chip driver description files and off chip application description files for off chip cores; and including said off chip cores and an external memory mapped test device in said system definition file.

21. The computer system of claim 17, further including the step of selecting driver definition files and application definition files from said project core catalog to be inputted into said code generator based on a set of cores comprising said integrated circuit chip.

22. The computer system of claim 17, wherein said driver definition files includes code supporting one or more operations selected from the group consisting of declaring functions the driver will support, installing interrupts, declaring symbols and values for registers in the drivers core and defining displayable print strings.

23. The computer system of claim 17, wherein said application definition file includes code supporting one or more operations selected from the group consisting of declaring driver devices, declaring testcases for test applications, declaring test application callbacks and defining displayable print strings.

24. The computer system of claim 17, wherein said system definition file includes code supporting one or more operations selected from the group consisting of declaring and configuring test applications, declaring and configuring drivers, declaring external memory-mapped test device symbols and assignments, declaring and configuring memory regions, declaring mutexes, declaring registers, declaring exerciser strings, creation of testcases, declaring testcases, and specifying status of multiple instances of the same test application.

* * * * *